(12) United States Patent
Subramani et al.

(10) Patent No.: US 7,297,247 B2
(45) Date of Patent: Nov. 20, 2007

(54) ELECTROFORMED SPUTTERING TARGET

(75) Inventors: Anantha K. Subramani, San Jose, CA (US); Anthony Vesci, San Jose, CA (US); Scott Dickerson, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 311 days.

(21) Appl. No.: 10/431,399

(22) Filed: May 6, 2003

(65) Prior Publication Data

US 2004/0222088 A1 Nov. 11, 2004

(51) Int. Cl.
*C25D 5/10* (2006.01)
*C25D 5/22* (2006.01)
*C25D 7/00* (2006.01)

(52) U.S. Cl. .............. 205/149; 205/114; 205/118; 205/170; 205/261; 204/484

(58) Field of Classification Search .............. 205/122, 205/131, 149, 151, 152, 153; 204/192.1, 204/298.02, 298.13, 298.16, 298.21
See application file for complete search history.

(56) References Cited

U.S. PATENT DOCUMENTS

| | | | |
|---|---|---|---|
| 3,716,462 A | 2/1973 | Jensen | |
| 3,725,220 A | 4/1973 | Kessler et al. | |
| 4,415,421 A | 11/1983 | Sasanuma | |
| 4,430,173 A | 2/1984 | Boudot et al. | |
| 5,435,965 A | 7/1995 | Mashima et al. | |
| 5,487,822 A | 1/1996 | Demaray et al. | |
| 5,803,342 A | 9/1998 | Kardokus | |
| 6,071,389 A | 6/2000 | Zhang | |
| 6,179,973 B1 | 1/2001 | Lai et al. | |
| 6,251,242 B1 | 6/2001 | Fu et al. | |
| 6,274,008 B1 | 8/2001 | Gopalraja et al. | |
| 6,277,249 B1 | 8/2001 | Gopalraja et al. | |
| 6,277,263 B1 | 8/2001 | Chen | |
| 6,283,357 B1 | 9/2001 | Kulkarni et al. | |
| 6,406,599 B1 | 6/2002 | Subramani et al. | |
| 6,413,382 B1 | 7/2002 | Wang et al. | |
| 6,419,806 B1 * | 7/2002 | Holcomb et al. | 204/298.12 |
| 6,436,251 B2 | 8/2002 | Gopalraja et al. | |
| 6,482,302 B1 * | 11/2002 | Li et al. | 204/298.13 |
| 6,619,537 B1 * | 9/2003 | Zhang et al. | 228/194 |
| 6,709,557 B1 * | 3/2004 | Kailasam et al. | 204/298.13 |
| 6,716,321 B2 * | 4/2004 | Gilmore et al. | 204/192.1 |
| 6,848,608 B2 * | 2/2005 | Wickersham, Jr. | 228/159 |
| 6,887,356 B2 * | 5/2005 | Ford et al. | 204/298.12 |
| 2001/0035237 A1 | 11/2001 | Nagano et al. | |
| 2001/0035238 A1 | 11/2001 | Nagano et al. | |

(Continued)

FOREIGN PATENT DOCUMENTS

GB 2 049 737 * 12/1980

(Continued)

*Primary Examiner*—Jennifer C. McNeil
*Assistant Examiner*—Jason L. Savage
(74) *Attorney, Agent, or Firm*—Janah & Associates

(57) ABSTRACT

A method of fabricating a sputtering target for sputter depositing material onto a substrate in a sputtering chamber is described. In one embodiment of the method, a preform having a surface is formed and a layer of sputtering material is electroplated onto the surface of the preform to form the target. The method can be applied to form a sputtering target having a non-planar surface.

20 Claims, 3 Drawing Sheets

U.S. PATENT DOCUMENTS

2002/0014289 A1  2/2002  Nagano et al.

FOREIGN PATENT DOCUMENTS

| JP | 58-147558 A | | 9/1983 |
|---|---|---|---|
| JP | 58-147558 A | * | 9/1983 |
| JP | 11-106904 | * | 4/1999 |
| WO | WO 01 39250 | | 5/2001 |

* cited by examiner

ELECTROFORMED SPUTTERING TARGET

BACKGROUND

The present invention relates to sputtering targets and their methods of manufacture.

A sputtering chamber is used to sputter deposit material onto a substrate to manufacture electronic circuits, such as for example, integrated circuit chips and displays. Typically, the sputtering chamber comprises an enclosure wall that encloses a process zone into which a process gas is introduced, a gas energizer to energize the process gas, and an exhaust port to exhaust and control the pressure of the process gas in the chamber. The chamber is used to sputter deposit a material from a sputtering target onto the substrate, such as a metal for example, aluminum, copper, tungsten or tantalum; or a metal compound such as tantalum nitride, tungsten nitride or titanium nitride. In the sputtering processes, the sputtering target is bombarded by energetic ions, such as a plasma, causing material to be knocked off the target and deposited as a film on the substrate.

In one version, a sputtering target may be formed by holding a sheet of spin-formed sputtering material against the surface of a target backing plate and diffusion-bonding the sputtering material to the backing plate by hot isostatic pressing. However, this method has several disadvantages. The sputtering material required to form the spin-formed sheet typically has to have a high level of purity, and consequently, is expensive. Target fabrication costs are driven even higher because both surfaces of the sheet of sputtering material are typically machined smooth to facilitate diffusion bonding to the underlying backing plate as well as to provide a smooth exposed sputtering surface. Targets formed by such a method can be undesirable because they can have a grain structure that is sheared by the forces generated in the spin-forming process, resulting in non-uniform grain sizes. Also, the targets can have undesirable pores and voids occurring in the bond between the backing plate and sputtering material. During processing, the non-uniform grain size and voids of the target can generate sputtered deposits that are non-uniform or uneven in thickness. The non-uniform and uneven deposition of the sputtered material can result in processed substrates having inferior quality, and can even damage structures formed on the substrate.

It is also difficult to form sputtering targets having convoluted or complex shapes using conventional processes. Targets having complex shapes are often used to provide enhanced sputtering coverage in magnetic fields, as described for example in U.S. Pat. No. 6,274,008 to Gopalraja et al., "Integrated Process for Copper Via Filling," commonly assigned to Applied Materials, which is incorporated herein by reference in its entirety. Such targets may comprise for example ridges, projections, rings, troughs, recesses and grooves. Conventional processes such as the spin forming process are not satisfactory in forming complex target shapes, because a significant amount of machining is required to cut out the desired convoluted shape from the spin formed layer. This machining is costly and wastes the expensive high purity sputtering material. Also, excessive machining can generate shearing forces on the surface of the target which plastically deform the grains on the target surface to produce an undesirable surface grain structure.

Thus, it is desirable to form sputtering targets having more uniform and consistent grain surface structure and with fewer voids. It is further desirable to form sputtering targets having complex or non-planar shapes reproducibly and with reduced costs.

SUMMARY

A sputtering target comprises an electroplated layer of sputtering material.

In a method of fabricating a sputtering target, a preform having a surface is formed, and a layer of sputtering material is electroplated onto the surface of the preform, thereby forming the sputtering target.

Another sputtering method comprises placing a substrate in a sputtering chamber, providing a sputtering target comprising an electroplated layer of sputtering material, providing a process gas in the sputtering chamber, and electrically biasing the target relative to a wall or support in the chamber to energize the process gas to sputter material from the target onto the substrate.

A sputtering chamber comprises a substrate support, a sputtering target facing the substrate support, the sputtering target comprising an electroplated layer of sputtering material, a gas delivery system to provide a gas in the chamber, a gas energizer to energize the gas to sputter the sputtering material from the sputtering target and onto the substrate, and an exhaust system to exhaust the gas.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

FIG. 1b is a partial sectional schematic side view of a magnetron suitable for the chamber of FIG. 1a;

DESCRIPTION

Figure 1A:
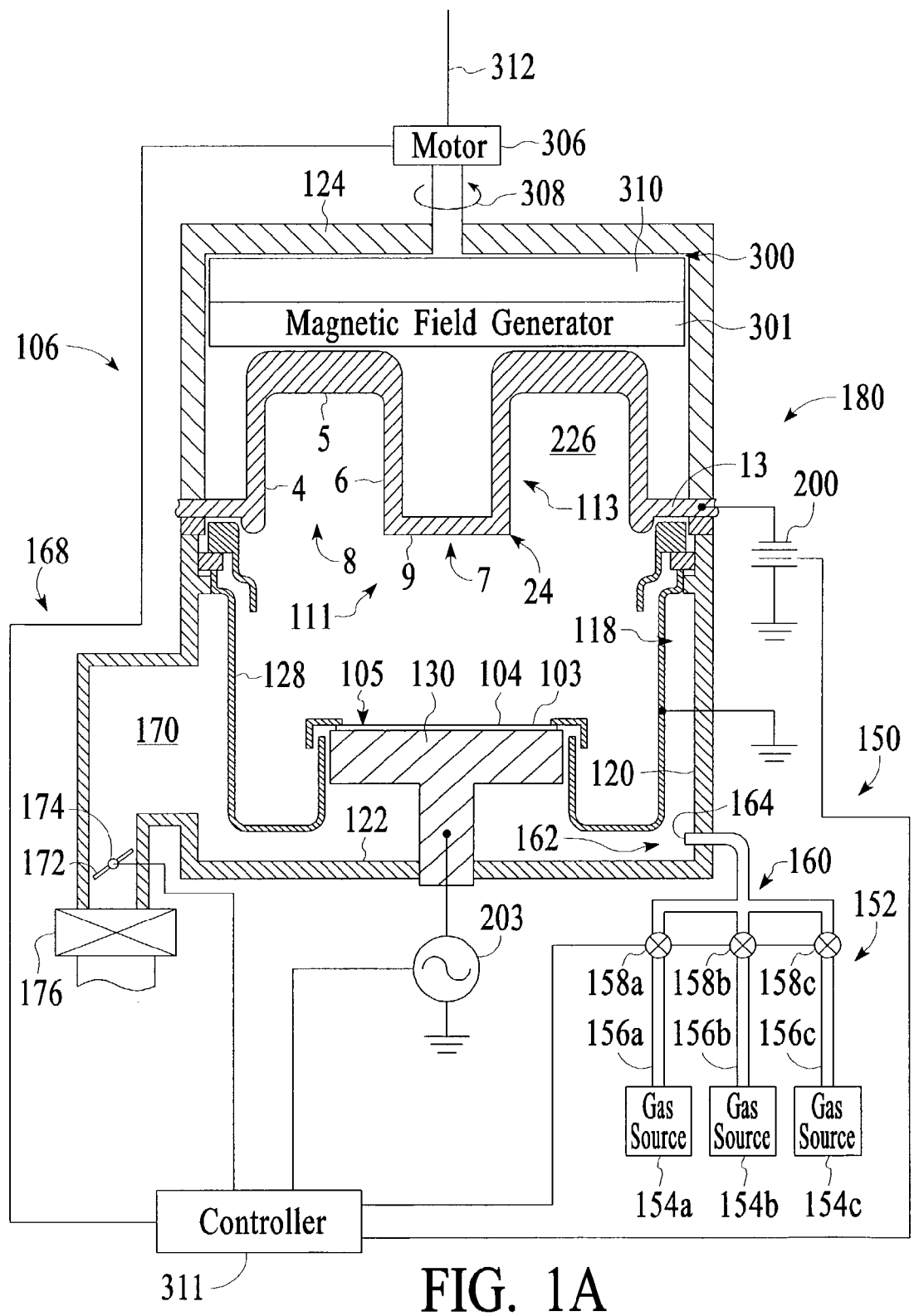
FIG. 1a is a partial sectional schematic side view of a version of a substrate processing chamber.

An exemplary version of a chamber 106 capable of sputter depositing material on a substrate 104 is schematically illustrated in FIG. 1a. The chamber 106 is representative of a self-ionized plasma chamber, such as an SIP+ type chamber, developed by Applied Materials, Inc. of Santa Clara, Calif. A typical chamber 106 comprises enclosure walls 118 that include sidewalls, 120, a bottom wall 122 and a ceiling 124. A substrate support 130 is provided to support a substrate 104 in the chamber 106. The substrate support 130 may be electrically floating or may be biased by a pedestal power supply 210, which may be for example an RF power supply 203. The substrate 104 is introduced into the chamber 106 through a substrate loading inlet (not shown) in a sidewall 120 of the chamber 106 and placed on the support 130. The support 130 can be lifted or lowered by support lift bellows (not shown) and a lift finger assembly (also not shown) can be used to lift and lower the substrate 104 onto the support 130 during transport of the substrate 104 into and out of the chamber 106.

A process gas, such as a sputtering gas, is introduced into the chamber 106 through a gas delivery system 150 that includes a process gas supply 152 comprising gas sources 154a-c that each feed a conduit 156a-c having a gas flow control valve 158a-c, such as a mass flow controller, to pass a set flow rate of the gas therethrough. The conduits 156a-c feed the gases to a mixing manifold 160 in which the gases are mixed to from a desired process gas composition. The mixing manifold 160 feeds a gas distributor 162 having one or more gas outlets 164 in the chamber 106. The gas outlets 164 may pass through the chamber sidewalls 120 to terminate about a periphery of the substrate support 130. The process gas may comprise a non-reactive gas, such as argon or xenon, that energetically impinges upon and sputters material from a target 111. The process gas may also comprise a reactive gas, such as one or more of an oxygen-containing gas and a nitrogen-containing gas, that are capable of reacting with the sputtered material to form a layer on the substrate 104. Spent process gas and byproducts are exhausted from the chamber 106 through an exhaust system 168 which includes one or more exhaust ports 170 that receive spent process gas and pass the spent gas to an exhaust conduit 172 in which there is a throttle valve 174 to control the pressure of the gas in the chamber 106. The exhaust conduit 172 feeds one or more exhaust pumps 176. Typically, the pressure of the sputtering gas in the chamber 106 is set to sub-atmospheric levels.

The sputtering chamber 106 further comprises a sputtering target 111 facing a surface 105 of the substrate 104. The target 111 can be a planar target (not shown) or a non-planar target (shown). The sputtering chamber 106 can also comprise a shield 128 to protect a wall 118 of the chamber 106 from sputtered material, and typically, to also serve as an anode with respect to the cathode target 111. The shield 128 may be electrically floating or grounded. The target 111 is electrically isolated from the chamber 106 and is connected to a target power supply 200, such as a pulsed DC power source, but which may also be other types of voltage sources. In one version, the target power supply 200, target 111, and shield 128 operate as a gas energizer 180 that is capable of energizing the sputtering gas to sputter material from the target 111. The target power supply 200 applies a bias voltage to the target 111 relative to the shield 128. The electric field generated in the chamber 106 from the voltage applied to the sputtering target 111 energizes the sputtering gas to form a plasma that energetically impinges upon and bombards the target 111 to sputter material off the target and onto the substrate 104. A suitable pulsing frequency of a pulsed DC voltage for energizing the process gas may be, for example, at least about 50 kHz, and more preferably less than about 300 kHz, and most preferably about 100 kHz. A suitable DC voltage level to energize the process gas may be, for example, from about 200 to about 800 Volts.

Figure 1B:
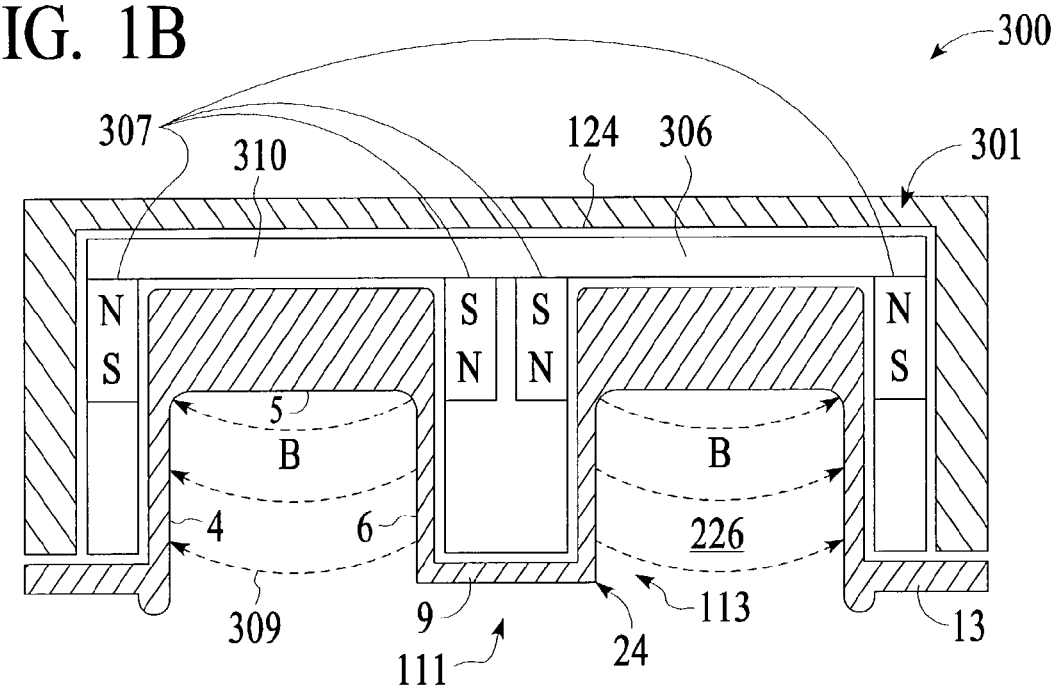

The chamber 106 further comprises a magnetron 300 comprising a magnetic field generator 301 that generates a magnetic field near the target 111 of the chamber 106 to increase an ion density in a high-density plasma region 226 adjacent to the target 111 to improve the sputtering of the target material, as shown in FIGS. 1a and 1b. An improved magnetron 300 may be used to allow sustained self-sputtering of copper or sputtering of aluminum, titanium, or other metals—while minimizing the need for non-reactive gases for target bombardment purposes, as for example, described in U.S. Pat. No. 6,183,614 to Fu, entitled "Rotating Sputter Magnetron Assembly"; and U.S. Pat. No. 6,274,008 to Gopairala et al., entitled "Integrated Process for Copper Via Filling," both of which are incorporated herein by reference in their entirety. The magnetic field extends through the substantially non-magnetic target 111 into the sputtering chamber 106. In one version, the improved magnetron 300 comprises a magnetic field generator 301 having magnets 307 that extend along one or more sidewalls of the target 111 and are connected by a magnetic yoke 310, as shown in FIG. 1b. The magnets 307 may comprise one or more of an inner magnet and outer magnet that are connected together by a yoke 310 that is formed of a magnetically soft material. The magnetic field generator 301 comprising the magnets 307 provides an enhanced magnetic field 309 in the region 226 enclosed by the target sidewalls, thereby increasing the density of the plasma in the region 226. In another version, the magnetron 300 comprises a motor 306 to rotate the magnetron 300 about a rotation axis 312 to provide an enhanced magnetic field, as shown in FIG. 1a. The motor 306 is typically attached to the magnetic yoke 310 of the magnetron 300 by a shaft 308 that extends along the rotation axis 312.

The chamber 106 can be operated by a controller 311 comprising a computer that sends instructions via a hardware interface to operate the chamber components, including the substrate support 130 to raise and lower the substrate support 130, the gas flow control valves 158a-c, the gas energizer 180, and the throttle valve 174. The process conditions and parameters measured by the different detectors in the chamber 106, or sent as feedback signals by control devices such as the gas flow control valves 158a-c, pressure monitor (not shown), throttle valve 174, and other such devices, are transmitted as electrical signals to the controller 311. Although, the controller 311 is illustrated by way of an exemplary single controller device to simplify the description of present invention, it should be understood that the controller 311 may be a plurality of controller devices that may be connected to one another or a plurality of controller devices that may be connected to different components of the chamber 106—thus, the present invention should not be limited to the illustrative and exemplary embodiments described herein.

In one version, a target 111 suitable for use in a sputtering chamber 106 comprises a complex shape, such as a shape comprising a non-planar surface 24, as shown in FIGS. 1a and 1b. The target 111 is typically circularly symmetric with respect to a main vertical axis of the chamber 106, and may comprise ridges, projections, rings, troughs, recesses, grooves or other topological features that enhance processing of the substrates 104. A target 111 having a complex shape has been discovered to provide improved sputtering properties, as described for example in aforementioned U.S. Pat. No. 6,274,008. The target 111 having the complex shape provides improved process performance by accommodating magnets 307 in proximity to and surrounding high density plasma regions 226 adjacent to the target 111, as shown in FIGS. 1a and 1b, or by otherwise providing for an enhanced magnetic field 309 that allows for a large thickness or volume of a sputtering plasma in high density plasma regions 226 adjacent to the target 111. The target 111 having the complex shape may also serve to improve deposition uniformity by regulating the effective target area to which portions of the substrate are exposed. For example, a recessed portion of the target 111, such as a trough 8, may be effectively hidden from regions of the substrate 104 that are more distant from the recessed portion, such as an outer edge 103 of the substrate 104, and thus deposition of material from the recessed portion onto the more distant regions of the substrate 104 may be reduced.

The target 111 comprises an inverted annular trough 8 comprising cylindrical outer and inner sidewalls 4,6 and a top wall 5 that at least partially enclose a high density region 226. The annular trough 8 encircles a central portion of the target 111 comprising a cylindrical well 7 that projects downwards towards the surface 105 of the substrate 104. The cylindrical inner sidewall 6 defines the sides of the cylindrical well 7, and the cylindrical well 7 is capped by a bottom wall 9 that faces the substrate 104. The bottom wall 9 and top walls 5 can be substantially parallel to the surface 105 of the substrate 104, and the inner and outer sidewalls 4,6 can be substantially perpendicular to the surface 105 of the substrate 104. At least a portion of the surface 24 of the side, top and bottom walls 4,5,6,9, comprises the sputtering material to be sputtered on the substrate 104. The inverted annular trough 8 and cylindrical well 7 can accommodate magnets 307 positioned between the outer sidewall 4 of the trough and the sidewall 120 or ceiling 124 of the chamber enclosure 118 and even within the space enclosed between the bottom and sidewalls 9, 6 of the cylindrical well 7 and ceiling 124 of the chamber enclosure 118, thereby providing an enhanced magnetic field 309 in the regions 226 adjacent to the target 111. The target 111 may further comprise a flange portion 13 that extends radially outward from the outer sidewall 4 to attach the target 111 to the chamber enclosure walls 118, for example by vacuum sealing the flange portion 13 of the target 111 between the ceiling 124 and sidewalls 120 of the chamber 106.

The target 111 can be formed in an electroforming process in which sputtering material is electroplated to form a complex or non-planar shape. Electroforming provides a sputtering material having a high purity and good grain properties, such as a higher uniformity of grain size. Electroforming can also generate a unitary sputtering material structure having fewer pores or voids. The method is suitable for forming targets 111 having sputtering material comprising, for example, one or more of copper, aluminum, tantalum, titanium and tungsten. The method generally comprises forming a preform 14 having a surface 16 and electroplating a layer 12 of sputtering material onto the surface 16 of the perform to form the sputtering target 111. FIGS. 2a through 2d schematically illustrate stages in an embodiment of a target fabrication process.

Figure 2A:
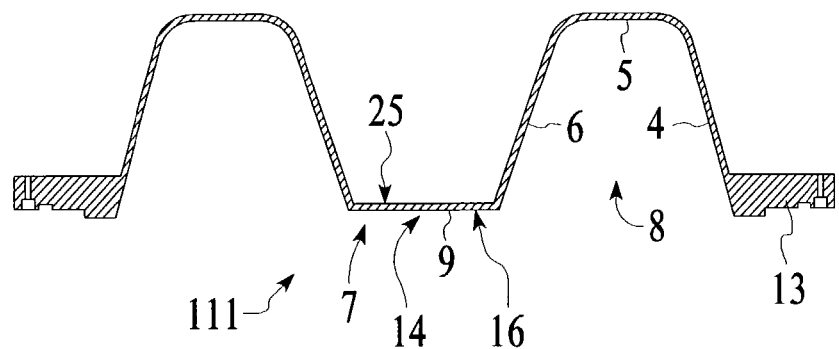
FIGS. 2a through 2d are partial sectional schematic side view illustrating stages in electroforming the sputtering target.

The target preform 14 provides a support structure on which the layer 12 of sputtering material can be electroplated, as shown in FIG. 2a. The preform 14 can comprise the same or a different material than the sputtering material. In one version, the preform 14 comprises a material that is more easily shaped than the sputtering material, and may also be of lower purity or less expensive than the sputtering material. The preform 14 is desirably formed from a material that is readily electroplated by the sputtering material, such as for example, a conducting or semiconducting material that can serve as an anode in an electroplating process. A suitable preform 14 may comprise, for example a metal, such as at least one of aluminum, copper, steel and titanium. For example, the preform 14 may comprise an industrial grade copper alloy. In one method of forming the preform 14, the metal material is heated to a molten state and poured into a mold having the desired preform shape. Cooling of the molten metal in the mold results in the preform 14 having the desired shape. The molded metal can also be machined or otherwise shaped to form features in the target preform 14.

The preform 14 can comprise a complex shape, such as a non-planar bottom surface 16, that at least partially defines the shape of the layer 12 of sputtering material electroplated over the surface 16. In the version shown in FIG. 2a, the preform 14 comprises an inverted annular trough 8 and central cylindrical well 7 having inner and outer cylindrical sidewalls 6,4 that are positioned to from a partially obtuse angle with the top wall 5 of the trough 8 such that the cylindrical sidewalls 6,4 form an angle with respect to one another of from about 5° to about 30°, thus forming a trough 8 having a width that narrows towards the top wall 5 of the trough 8. The preform 14 having the complex shape serves as a support structure for the formation of the non-planar electroplated layer 12.

Figure 3:
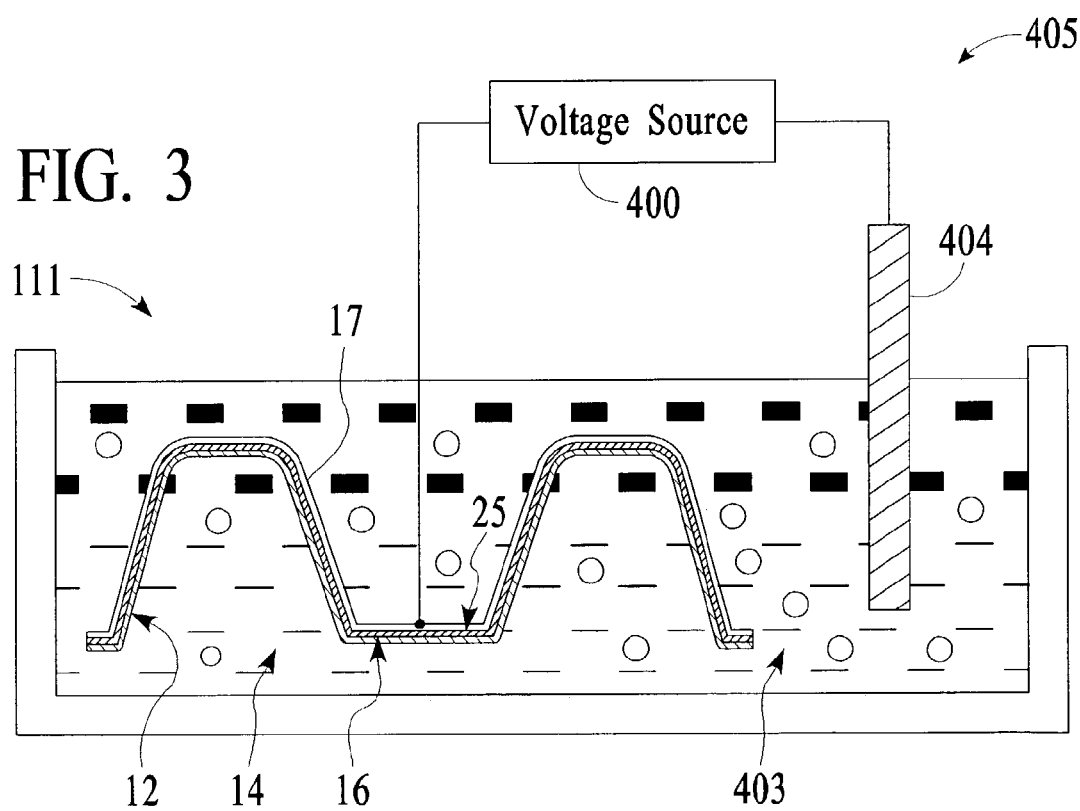
FIG. 3 is a partial sectional schematic side view of a version of an electroplating apparatus for electroforming a target.

Sputtering material is electroplated onto the preform 14 to form the electroplated layer 12 via an electroplating process. In the electroplating process, one or more surfaces of the preform 14, such as one or more of the top and bottom surfaces 25,16 is exposed to an electroplating bath solution 403 in an electroplating apparatus 405, as shown in FIG. 3. The electroplating solution comprises an aqueous solution having electrolytes comprising the sputtering material dissolved therein. For example, the electroplating solution may comprise one or more of a copper-containing solution, such as $CuSO_4$, an aluminum-containing solution, such as $AlSO_4$, a tantalum-containing solution, a titanium-containing solution and a tungsten-containing solution. A bias voltage is applied to the surface 16 of the preform 14 via a voltage source 400 that is electrically connected to the surface 16 of the preform 14. The voltage source 400 is also connected to an electrode 404 that is in electrical communication with the surface 16, for example via the conducting electroplating solution 403. The electrode 404, may comprise an inert material or may be at least partially formed from a sputtering material, such as copper. The bias voltage from the voltage source induces the build up of a negative charge on the surface 16 of preform 14. This negative charge reduces dissolved ions and electrolytes in solution containing the sputtering material to their elemental state at the surface 16 of the preform 14, thereby forming the layer 12 of electroplated sputtering material on the surface 16. In other words, the sputtering material is "plated out" on the surface 16 of the preform 14. For example, copper ions from a copper sulfate electrolyte dissolved in solution are reduced to elemental copper at the surface 16 of the preform 14 upon application of the bias voltage, thereby "plating out" a layer 12 of copper on the surface 16 of the preform 14.

The shape of the electroplated layer 12 at least partially conforms to the shape of the underlying surface 16 of the preform 14. For example, for a preform 14 having a non-planar surface 16, such as that shown in FIG. 2a, the electroplated layer 12 formed on the surface 16 also comprises a non-planar surface 18, and may comprise a complex shape comprising the inverted annular trough 8 and central cylindrical well 7. Thus, the shape of the surface 16 of the preform 14 is at least partially transferred to the electroplated layer via the electroplating process. The electroplated layer may be grown on the surface 16 to a thickness of, for example, from about 0 μm to about 1 μm, such as about 0.5 μm. The thickness of the electroplated layer may even be at least about 0.5 μm, and even at least about 1 μm.

The conditions maintained during the electroplating process, such as the concentration and composition of the electrolytes, the applied bias voltage, the pH of the bath solution and the temperature of the solution may be selected to provide an electroplated layer 12 having the desired composition and structure. Also, in addition or as an alternative to an aqueous (water-based) electroplating solution, the solution can comprise an organic solvent. In one version of a suitable electroforming process, sputtering material comprising elemental copper is formed on the non-planar surface 16 of the perform 14 by immersing the surface 16 in an aqueous solution comprising from about 150 to about 300 g/L $CuSO_4.5H_2O$, and even from about 210 to about 214 g/L $CuSO_4.5H_2O$. The solution further comprises from about 30 g/L to about 100 g/L $H_2SO_4$, and even from about 52 g/L to about 75 g/L $H_2SO_4$. The electrode 404 can be formed from wrought phosphorized copper or oxygen free copper (OFC). The temperature of the solution is maintained at from about 15° C. to about 45° C., and even from about 21° C. to about 32° C. A bias voltage is applied at a power level sufficient to provide a current density of from about 0.5 A/dm$^2$ (amps per decimeter squared) to about 20 A/dm$^2$, and even from about 1 A/dm$^2$ to about 10 A/dm$^2$. A batch electroforming process can be performed to simultaneously form the electroplated layer 12 on a number of performs 14, such as from about 10 to 20 preforms 14.

Figure 2B:
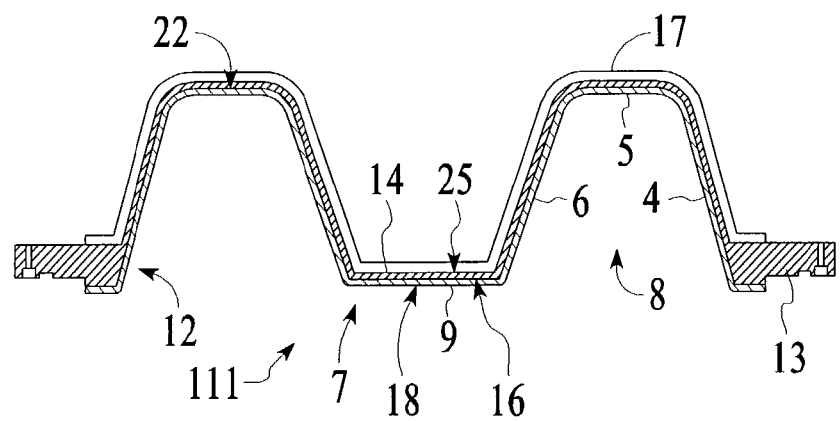

In one version, at least a portion of a surface of the preform 14 may be masked to inhibit the electroplating of the sputtering material onto the surface. Masking of the surface allows for selective plating of the sputtering. For example, as shown in FIG. 2b, a mask 17 may be provided to at least partially cover the top surface 25 of the preform 14 to allow electroplating of the sputtering materials substantially only on the bottom surface 16 of the preform 14. In one version, the surface may be masked by applying a less conductive material, such as a polymer or other dielectric material, to the surface to be masked. The less conductive material inhibits the build-up of charge on the surface 25, thereby inhibiting the reduction of sputtering materials in the solution onto the surface 25 of the preform 14. Masking of one or more surface may be particularly desirable in cases where the preform 14 has a complex shape or non-planar shape in which exposure of the surface to be electroplated may also expose other surfaces of the preform 14. The mask 17 can be subsequently removed after an electroplating step is performed Following electroplating of the sputtering material, the surface 18 of the electroplated layer 12 can be cleaned in a wet or dry cleaning process. The cleaning process removes particulates and other impurities from the surface 18 of the electroplated layer 12. In one version, the surface 18 of the electroplated layer is cleaned in a wet cleaning process comprising an acid rinse. In the acid rinse, the surface 18 is immersed in an aqueous acidic solution such as HCl, to remove particulates from the surface 18 of the layer 12. A de-ionized water rinse can also be performed to remove any particulates loosened from the substrate 104 during the acid rinse and neutralize any remaining acid. The surface of the electroplated layer 12 can also be cleaned by an ultrasonic rinse that dislodges any loose particulates from the surface of the layer via ultrasonic vibrations. The surface of the electroplated layer 12 can further be machined or otherwise polished before or after the cleaning steps to provide a smooth surface 18 for the sputtering process.

The electroplated layer 12 of sputtering material provides several advantages. Because the electroplated sputtering material is "grown" from the surface 16 of the preform 14, the layer 12 of sputtering material has a high uniformity of sputtering material grain size. For example, a layer 12 having a uniform sputtering material grain size of from about 10 to about 100 μm can be achieved. This high grain size uniformity increases the uniformity of the layers of material sputtered onto the substrate 104, and reduces the occurrence of undesirably large grains or "clumps" or sputtering material that could damage or contaminate the substrate 104. The electroplated sputtering material grown on the surface 16 of the preform 14 forms a strong bond to the preform 14 and forms a continuous and unitary structure through out the layer 12, thus reducing the incidence of pores and voids in the layer 12 and between the layer 12 and preform 14. A further advantage is that machining of the top surface 25 of the preform 14 and bottom surface 16 of the electroplated layer 12 is not required to bond the electroplated layer 12 to the preform 14. Yet another advantage of the method of fabricating the target 111 is that a target 111 having a complex shape may be manufactured substantially without extensive machining of a costly bulk sputtering material to form a target 111 having the desired shape, by "growing" the sputtering material on a surface 16 of a preform 14 comprising a complex shape that is at least partially transferred to the overlying conformal electroplated layer 12.

In one version, at least a portion of the preform 14 is removed following formation of the electroplated layer 12. The preform 14 is desirably at least partially removed to expose a portion of a top surface 22 of the electroplated layer 12. In one version, the preform 14 is even substantially entirely removed from the electroplated layer 12 to expose substantially the entire top surface 22 of the electroplated layer 12, as shown for example in FIG. 2c. Desirably, the portion of the preform 14 is removed by a method that allows for removal of at least a portion of the preform 14 substantially without damaging the electroplated layer 12. The preform 14 can be at least partially removed by, for example, machining away portions of the preform 14 from the electroplated layer 12.

Figure 2C:
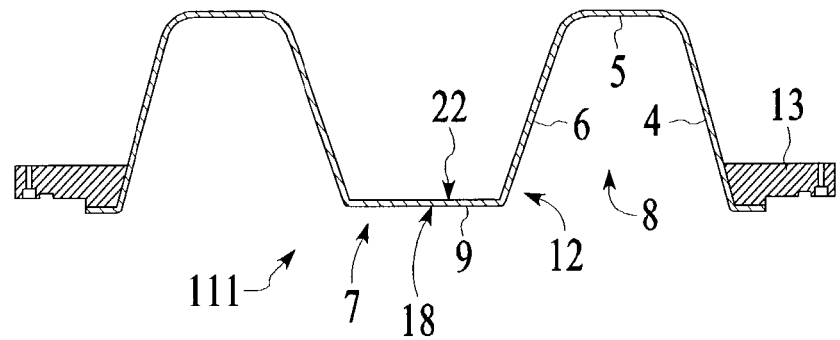
Figure 2D:
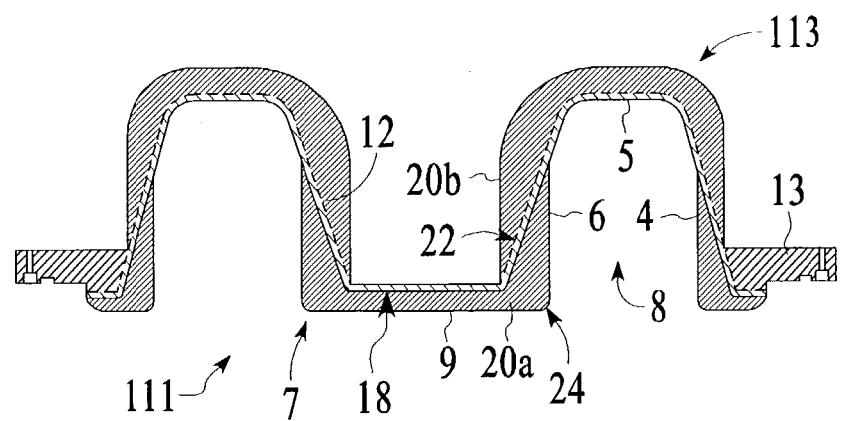

A subsequent electroplating process can be performed to electroplate one or more additional layers 20a,b of sputtering material onto the original or first layer 12, as shown for example in FIG. 2d. The subsequent electroplating process allows for the formation of an electroplated target 111a comprising a desired thickness of sputtering material. The additional layers 20a,b of sputtering material are electroplated on at least one of the top surface 22 and the bottom surface 18 of the first electroplated layer 12. The sputtering material can be electroplated on the top surface 22 of the first layer 12 and on portions of the bottom surface 18 of the first layer 12 that have been exposed by removal of the preform 14 from the layer 12. In one version, a portion of the top or bottom surface can be masked to selectively electroplate material substantially on only one of the surfaces. In another version, both the top and bottom surfaces 22,18 of the first layer 12 are electroplated, as shown for example in FIG. 2d. The subsequent electroplated layers 20a,b are "grown" out of the first electroplated layer 12 via the electroplating process, and thus the first electroplated layer 12 and subsequent electroplated layers 20a,b form a unitary and continuous structure that is absent a discrete and sharp crystalline boundary therebetween, as schematically illustrated in FIG. 2d with a dotted line. Accordingly, the electroplated layers 12, 20a,b form a strongly bonded and continuous target structure 113 having enhanced properties, such as improved grain size uniformity and fewer pores or voids.

The subsequent layers 20a,b may be electroplated at varying rates along the surface of the first layer 12 having the non-planar surfaces 18,22 and complex shape shown in FIGS. 2b through 2d. The layers 20a,b are electroplated at a faster rate on the "open" regions of surfaces 18,22 of the non-planar layer 12, such as on bottom surface 18 of the bottom wall 9 of the cylindrical well 7 and on the top surface 22 of the upper walls 5 of the inverted annular trough 8, where the open shape of the first electroplated layer 12 allows better access of reactive ions and electrolytes in the electroplating solution to the surfaces 18,22 of the layer 12. Portions of the first non-planar layer 12 such as the bottom surface 18 of the top wall 5 and top surface 22 of the bottom wall 9 grow the electroplated layer at a slower rate due to the proximity of inner and outer sidewalls 6,4 surrounding these regions that at least partially restrict the flow and access of reactive ions and electrolytes to these surfaces. Because of this electroplating rate distribution, the growth of the subsequent electroplated layers 20a20b forms inner and outer target structure sidewalls 6,4 that are more perpendicular to the surface 105 of the substrate 104 and bottom and top walls 9,5 of the target than the original target preform sidewalls 6,4, thereby providing the desired target shape, as shown for example in FIGS. 2d and 1a through 1b. The electroplating process may be performed to grow a layer 20b of sputtering material on the top surface 22 of the first layer 12 comprising a thickness of from about 0.1 µm to about 1 µm, such as about 0.5 µm, and may even be at least about 0.5 µm, and even at least about 1 µm. A layer 20a of sputtering material may be grown on the bottom surface 18 of the first electroplated layer 12 via the electroplating process to a thickness of from about 0.1 µm to about 1 µm, such as about 0.5 µm, and may even be at least about 0.5 µm, and even at least about 1 µm.

The subsequent layers 20a,b may be applied in an electroforming process comprising the same process conditions, such as electrolyte concentration, bias voltage, pH and temperature, as in the first electroforming process to electroplate the first layer 12, or may comprise different process conditions. A suitable duration of the electroforming process to form the electroformed layer may be from about 12.5 to about 25 hours. Following the electroplating process, the target 111 comprising the multiple layers 12, 20a,b of sputtering material may be further machined to provide the desired target dimensions and to provide a smooth target surface 24 and may also be cleaned to remove particulates from the surface 24.

The above described method provides a target 111 comprising one or more electroplated layers 12, 20a,b having improved properties in the processing of substrates. The method is suited for the formation of targets 111 having planar or non-planar surfaces 24 and may even be performed to fabricate targets having complex convoluted shapes, such as the target 111 shown in FIGS. 1a,b and 2d. Although the present invention has been described in considerable detail with regard to certain preferred versions thereof, other versions are possible. For example, the present invention could be used to form targets having other shapes than those specifically mentioned, and could be used to form targets comprising other sputtering materials besides those mentioned. The process chamber 106 may also comprise other equivalent configurations as would be apparent to one of ordinary skill in the art. Thus, the appended claims should not be limited to the description of the preferred versions contained herein.

What is claimed is:

1. A method of fabricating a sputtering target, the method comprising:
    (a) forming a preform comprising an inverted annular trough comprising cylindrical outer and inner sidewalls and a top wall, the inverted annular trough encircling a central cylindrical well having a bottom wall;
    (b) electroplating a first layer of sputtering material onto the surface of the preform;
    (c) removing the preform from the first electroplated layer; and
    (d) electroplating a second layer of sputtering material onto the first electroplated layer, thereby forming the sputtering target.

2. A method according to claim 1 wherein (b) comprises electroplating a first layer of sputtering material consisting essentially of copper, aluminum, tantalum, titanium or tungsten.

3. A method according to claim 1 wherein (a) comprises forming a preform comprising at least one of aluminum, copper, steel and titanium.

4. A method according to claim 1 wherein (d) comprises electroplating a second layer of sputtering material consisting essentially of copper, aluminum, tantalum, titanium or tungsten.

5. A method according to claim 1 wherein in (a) the outer sidewall is parallel to the inner sidewall.

6. A method according to claim 1 wherein in (a) the outer and inner sidewalls are angled outwards.

7. A method according to claim 1 wherein in (a) a flange portion extends radially outward from the outer sidewall.

8. A method according to claim 1 wherein (b) comprises electroplating the first layer of sputtering material onto the surface of the preform that faces the substrate when the target is mounted in a sputtering chamber.

9. A method according to claim 1 wherein (b) comprises electroplating a first layer comprising copper.

10. A method according to claim 1 wherein (d) comprises electroplating a second layer comprising copper.

11. A method of fabricating a sputtering target, the method comprising:
    (a) forming a preform comprising an inverted annular trough comprising cylindrical outer and inner sidewalls and a top wall, the inverted annular trough encircling a central cylindrical well having a bottom wall, the preform having a surface;
    (b) electroplating a first layer of sputtering material onto the surface of the preform;
    (c) removing at least a portion of the preform from the electroplated layer to expose an underlying surface of the electroplated layer; and
    (d) electroplating a second layer of sputtering material onto the underlying surface.

12. A method according to claim 11 wherein (b) comprises electroplating a first layer of sputtering material comprising at least one of aluminum, copper, tantalum, titanium and tungsten.

13. A method according to claim 11 wherein (a) comprises forming a preform comprising at least one of aluminum, copper, steel and titanium.

14. A method according to claim 11 wherein (b) comprises electroplating the first layer of sputtering material on a surface of the annular inverted trough and central cylindrical well.

15. A method according to claim 11 wherein in (a) the outer sidewall is parallel to the inner sidewall.

16. A method according to claim 11 wherein in (a) the outer and inner sidewalls are angled outwards.

17. A method according to claim 11 wherein in (a) a flange portion extends radially outward from the outer sidewall.

18. A method according to claim 9 wherein (b) comprises electroplating the first layer of sputtering material onto the surface of the preform that faces the substrate when the target is mounted in a sputtering chamber.

19. A method according to claim 11 wherein (b) comprises electroplating a first layer comprising copper.

20. A method according to claim 11 wherein (d) comprises electroplating a second layer comprising copper.

* * * * *